(12) United States Patent
Cho et al.

(10) Patent No.: US 11,373,932 B2
(45) Date of Patent: Jun. 28, 2022

(54) SEMICONDUCTOR PACKAGES INCLUDING THROUGH HOLES AND METHODS OF FABRICATING THE SAME

(71) Applicant: Samsung Electronics Co., Ltd., Suwon-si (KR)

(72) Inventors: Hyoukyung Cho, Seoul (KR); Daesuk Lee, Suwon-si (KR); Jinnam Kim, Anyang-si (KR); Taeseong Kim, Suwon-si (KR); Kwangjin Moon, Hwaseong-si (KR); Hakseung Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/750,579

(22) Filed: Jan. 23, 2020

(65) Prior Publication Data

US 2021/0005533 A1 Jan. 7, 2021

(30) Foreign Application Priority Data

Jul. 5, 2019 (KR) .................. 10-2019-0081342

(51) Int. Cl.
*H01L 23/48* (2006.01)
*H01L 23/00* (2006.01)
(Continued)

(52) U.S. Cl.
CPC ........ *H01L 23/481* (2013.01); *H01L 21/0217* (2013.01); *H01L 21/02164* (2013.01); *H01L 21/30604* (2013.01); *H01L 21/76831* (2013.01); *H01L 21/76898* (2013.01); *H01L 23/5283* (2013.01); *H01L 23/53295* (2013.01); *H01L 24/08* (2013.01); *H01L 24/89* (2013.01); *H01L 25/0657* (2013.01); *H01L 21/0274* (2013.01); *H01L 21/02271* (2013.01);
(Continued)

(58) Field of Classification Search
CPC ......... H01L 27/14636; H01L 27/14634; H01L 27/1469; H01L 23/481; H01L 24/08
See application file for complete search history.

(56) References Cited

U.S. PATENT DOCUMENTS 4,984,039 A 1/1991 Douglas
5,180,689 A 1/1993 Liu et al.
(Continued)

FOREIGN PATENT DOCUMENTS

CN 104011261 A 8/2014

*Primary Examiner* — Jaehwan Oh
*Assistant Examiner* — John M Parker
(74) *Attorney, Agent, or Firm* — Harness, Dickey & Pierce, P.L.C.

(57) ABSTRACT

Disclosed are semiconductor packages and methods of fabricating the same. The semiconductor package comprises a first wiring layer, a first semiconductor substrate on the first wiring layer, a first dielectric layer on the first semiconductor substrate, a landing pad in the first wiring layer, a through hole that penetrates the first semiconductor substrate, the first dielectric layer, and the first wiring layer and exposes the landing pad, the through hole including a first hole and a second hole on a bottom end of the first hole, the second hole having a maximum diameter less than a minimum diameter of the first hole, and a mask layer on an upper lateral surface of the through hole.

19 Claims, 7 Drawing Sheets

(51) Int. Cl.
  *H01L 25/065* (2006.01)
  *H01L 23/532* (2006.01)
  *H01L 21/768* (2006.01)
  *H01L 21/02* (2006.01)
  *H01L 21/306* (2006.01)
  *H01L 23/528* (2006.01)
  *H01L 21/027* (2006.01)
  *H01L 21/288* (2006.01)
  *H01L 21/321* (2006.01)

(52) U.S. Cl.
  CPC ...... *H01L 21/2885* (2013.01); *H01L 21/3212* (2013.01); *H01L 21/7684* (2013.01); *H01L 21/76841* (2013.01); *H01L 21/76879* (2013.01); *H01L 23/53238* (2013.01); *H01L 24/05* (2013.01); *H01L 2224/0557* (2013.01); *H01L 2224/08147* (2013.01); *H01L 2224/80001* (2013.01); *H01L 2225/06541* (2013.01); *H01L 2225/06565* (2013.01)

(56) References Cited

U.S. PATENT DOCUMENTS

| | | | | |
|---|---|---|---|---|
| 6,078,073 | A | * | 6/2000 | Habu ................ H01L 27/10873 |
| | | | | 257/296 |
| 6,083,822 | A | * | 7/2000 | Lee ................... H01L 21/76813 |
| | | | | 257/750 |
| 6,251,754 | B1 | * | 6/2001 | Ohshima .......... H01L 21/76254 |
| | | | | 257/E21.568 |
| 6,329,118 | B1 | | 12/2001 | Hussein et al. |
| 6,448,177 | B1 | | 9/2002 | Morrow et al. |
| 6,479,391 | B2 | | 11/2002 | Morrow et al. |
| 6,787,469 | B2 | | 9/2004 | Houston et al. |
| 6,818,552 | B2 | | 11/2004 | Daniels et al. |
| 7,361,587 | B1 | | 4/2008 | Li et al. |
| 7,968,506 | B2 | | 6/2011 | Chou et al. |
| 7,977,797 | B2 | * | 7/2011 | Li ..................... H01L 21/76804 |
| | | | | 257/760 |
| 2002/0039843 | A1 | * | 4/2002 | Ikeda ............... H01L 21/76897 |
| | | | | 438/738 |
| 2014/0335411 | A1 | | 11/2014 | Liu et al. |
| 2017/0040373 | A1 | * | 2/2017 | Kim ...................... H01L 23/481 |
| 2020/0043969 | A1 | * | 2/2020 | Guan ............... H01L 27/14636 |
| 2020/0294970 | A1 | * | 9/2020 | Uh ................... H01L 21/76852 |
| 2021/0028218 | A1 | * | 1/2021 | Zhang .............. H01L 27/14643 |

\* cited by examiner

SEMICONDUCTOR PACKAGES INCLUDING THROUGH HOLES AND METHODS OF FABRICATING THE SAME

CROSS-REFERENCE TO RELATED APPLICATION

This U.S. nonprovisional application claims priority under 35 U.S.C § 119 to Korean Patent Application No. 10-2019-0081342 filed on Jul. 5, 2019 in the Korean Intellectual Property Office, the entire contents of which are hereby incorporated by reference.

BACKGROUND

Various example embodiments of the inventive concepts described herein relate to semiconductor packages including through holes and methods of fabricating the same.

There is demand for light, small, fast, multifunctional, excellently performing, and highly reliable products in the electronic industry such as mobile phones and laptop computers. Research has continuously been conducted on semiconductor package technology as one solution to satisfy these demands. Two-dimensional connections between integrated circuits using conventional wire bonding may have certain disadvantages, such as signal loss, high power consumption, and design constraints on bonding wires. Three-dimensional integrated circuit package technologies that vertically connect stacked semiconductor chips may overcome some such disadvantages. In some three-dimensional integrated circuit package technologies, a through silicon via (TSV) is employed to vertically connect semiconductor chips. The three-dimensional integrated circuit package technology using the through silicon via (TSV) may achieve highly-integrated circuits on the same space and yield shorter circuit-to-circuit connections. It is desired to improve reliability and electrical characteristics of semiconductor packages that are fabricated by the three-dimensional integrated package technology using the through silicon via.

SUMMARY

Some example embodiments of the present inventive concepts provide semiconductor packages with improved reliability.

Some embodiments of inventive concepts provide methods of fabricating semiconductor packages with improved reliability.

According to some example embodiments of the present inventive concepts, a semiconductor package may comprise: a first wiring layer; a first semiconductor substrate on the first wiring layer; a first dielectric layer on the first semiconductor substrate; a landing pad in the first wiring layer; a through hole that penetrates the first semiconductor substrate, the first dielectric layer, and the first wiring layer, the through hole exposing the landing pad the through hole may be include a first hole and a second hole on a bottom end of the first hole, the second hole having a maximum diameter may be less than a minimum diameter of the first hole; and a mask layer on an upper lateral surface of the through hole. According to some example embodiments of the present inventive concepts, a semiconductor package may comprise: a first wiring layer; a first semiconductor substrate on the first wiring layer; a first dielectric layer on the first semiconductor substrate; a landing pad in the first wiring layer; a through hole that penetrates the first semiconductor substrate, the first dielectric layer, and the first wiring layer, the through hole exposing the landing pad the through hole may include a first hole and a second hole on a bottom end of the first hole, the second hole having a maximum diameter may be less than a minimum diameter of the first hole; a mask layer on an upper lateral surface of the through hole, a through electrode in the through hole; an external connection pad on the through electrode; and a die electrically connected to the first wiring layer.

According to some example embodiments of the present inventive concepts, a method of fabricating a semiconductor package may comprise: forming a first hole in a semiconductor substrate and in a first dielectric layer on the semiconductor substrate; forming a mask pattern on an upper lateral surface of the first hole; and forming a second hole in a first wiring layer on a bottom surface of the semiconductor substrate, the second hole vertically overlapping the first hole. The second hole may expose a landing pad in the first wiring layer. A diameter of the second hole may be less than a diameter of the first hole.

DETAILED DESCRIPTION OF EMBODIMENTS

Some example embodiments of the present inventive concepts will now be described in detail with reference to the accompanying drawings to aid in clearly explaining the present inventive concepts.

Spatially relative terms, such as "beneath," "below," "lower," "under," "above," "upper," etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Figure 1A:
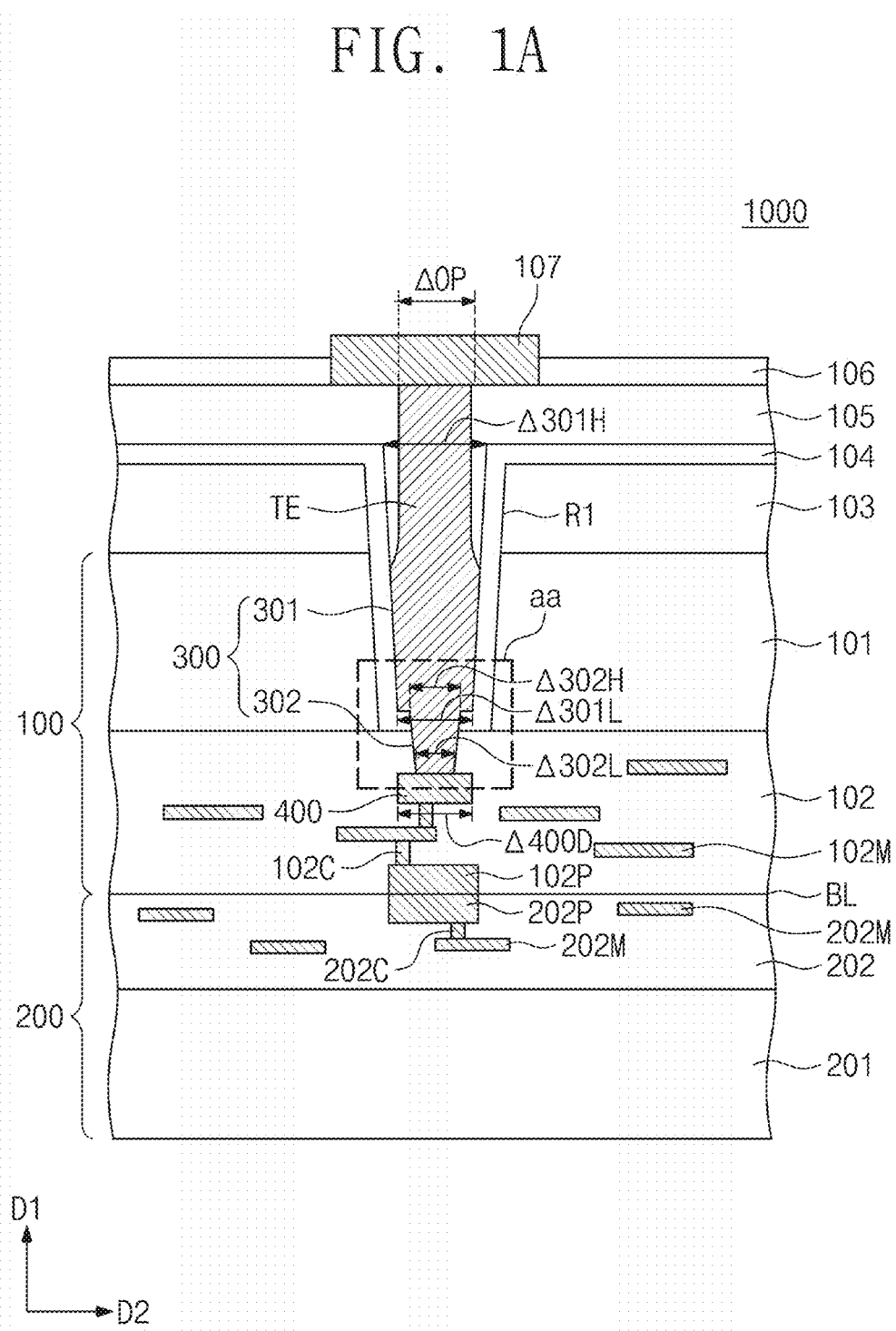
FIG. 1A illustrates a cross-sectional view showing a semiconductor package according to some example embodiments of the present inventive concepts.
Figure 1B:
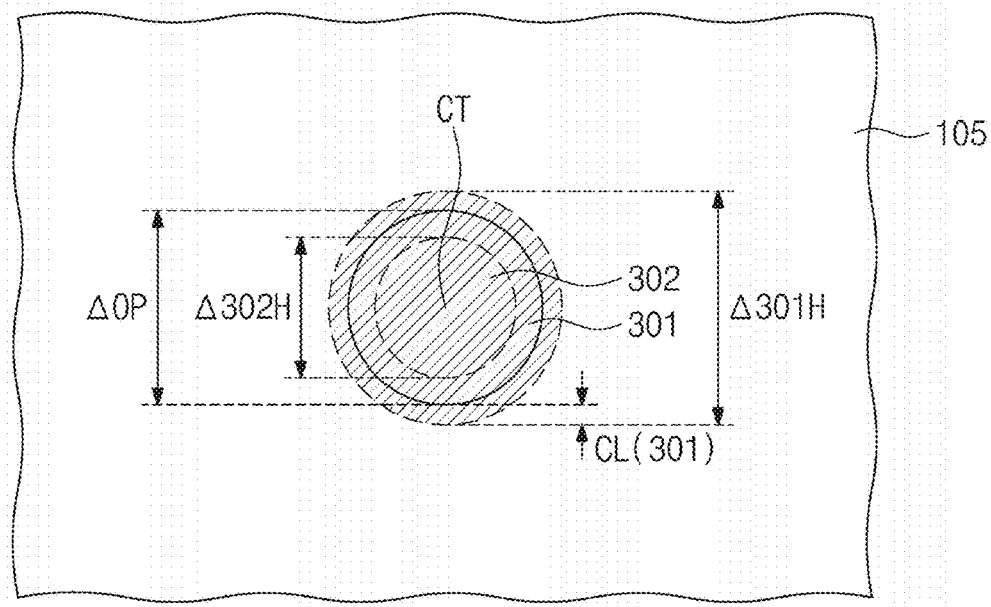
FIG. 1B illustrates a plan view of FIG. 1A.
Figure 1C:
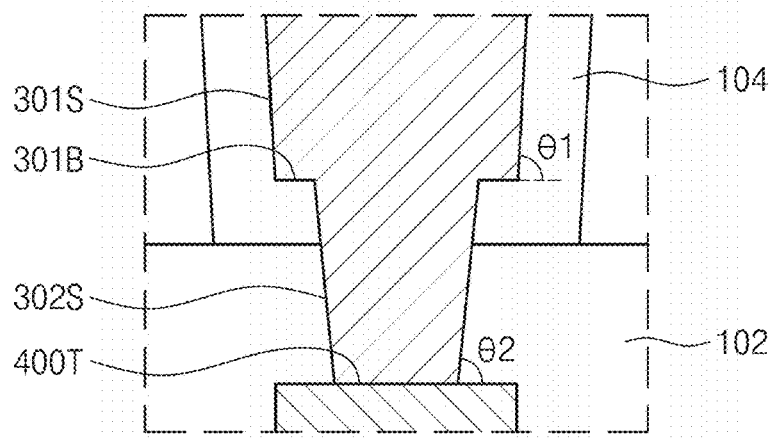
FIG. 1C illustrates an enlarged view showing section aa of FIG. 1A.

FIG. 1A illustrates a cross-sectional view showing a semiconductor package according to some example embodiments of the present inventive concepts. FIG. 1B illustrates a plan view of FIG. 1A. FIG. 1C illustrates an enlarged view showing section aa of FIG. 1A. In FIG. 1B, some components shown in FIG. 1A are omitted to clearly represent other components.

Referring to FIGS. 1A to 1C, a semiconductor package 1000 according to the present inventive concepts may include a first die 100 and a second die 200.

The first die 100 may be disposed on the second die 200, and a bonding layer BL may be provided between the first die 100 and the second die 200. The bonding layer BL may include a dielectric layer (not shown) and a conductive pattern (not shown) in the dielectric layer (not shown). The bonding layer BL may have viscosity to adhere the first die 100 and the second die 200 to each other. The conductive pattern of the bonding layer BL may electrically connect first and second connection pads 102P and 202P, which will be discussed below, respectively of the first and second dies 100 and 200.

The first die 100 may include a first semiconductor substrate 101 and a first wiring layer 102. In FIG. 1A, the first die 100 may be turned upside down such that the first semiconductor substrate 101 may be disposed above the first wiring layer 102.

The first semiconductor substrate 101 may include, for example, a silicon substrate on which a semiconductor integrated circuit is formed. The first semiconductor substrate 101 may include a semiconductor device, such as a transistor.

The first wiring layer 102 may include a plurality of dielectric layers and a plurality of first conductive patterns 102M interposed therebetween. The first wiring layer 102 may be provided therein with a plurality of first conductive contacts 102C that electrically connect to each other ones of the first conductive patterns 102M.

A landing pad 400 may be provided in the first wiring layer 102. The landing pad 400 may be disposed adjacent to a top surface of the first wiring layer 102. A first connection pad 102P may be provided on a lower portion of the first wiring layer 102.

The second die 200 may include a second semiconductor substrate 201 and a second wiring layer 202. The second semiconductor substrate 201 may include, for example, a silicon substrate on which a semiconductor integrated circuit is formed. The second semiconductor substrate 201 may include a semiconductor device, such as a transistor.

The second wiring layer 202 may include a plurality of dielectric layers (not designated by reference numerals) and a plurality of second conductive patterns 202M interposed between the dielectric layers. The second wiring layer 202 may be provided therein with a plurality of second conductive contacts 202C that electrically connect to each other ones of the second conductive patterns 202M.

A second connection pad 202P may be provided on an upper portion of the second wiring layer 202.

A first dielectric layer 103 may be provided on the first semiconductor substrate 101. The first dielectric layer 103 may include, for example, silicon oxide ($SiO_2$).

A recess R1 may be provided in the first dielectric layer 103 and the first semiconductor substrate 101. The recess R1 may have a circular or almost circular shape when viewed in plan. A liner 104 may be provided on a sidewall of the recess R1 and on a portion of a bottom surface of the recess R1. The liner 104 may include a dielectric material, such as silicon oxide. For example, the liner 104 may be disposed on a top surface of the first dielectric layer 103, a lateral surface of the first dielectric layer 103 exposed to the recess R1, a lateral surface of the first semiconductor substrate 101, and a portion of the top surface of the first wiring layer 102. The liner 104 may fill a portion of the recess R1.

A through hole 300 may be provided in the first dielectric layer 103, the first semiconductor substrate 101, and the first wiring layer 102. The through hole 300 may include a first hole 301 that corresponds to a portion, which is not occupied by the liner 104, of the recess R1 and may also include a second hole 302 that extends from the first hole 301 into the first wiring layer 102. The second hole 302 may exposed a top surface 400T of the landing pad 400.

The first hole 301 and the second hole 302 may overlap each other in a first direction D1 perpendicular to a top surface of the first semiconductor substrate 101. Each of the first and second holes 301 and 302 may have a circular or almost circular shape when viewed in plan. The first hole 301 may have a center CT substantially the same as that of the second hole 302.

The first hole 301 may have a diameter that decreases with decreasing distance from a bottom surface of the first semiconductor substrate 101. The diameter of the first hole 301 may decrease, for example, almost linearly. In other embodiments, the diameter of the first hole 301 may have a curved or stepped decrease. Therefore, the first hole 301 may have a maximum diameter that corresponds to a diameter $\Delta 301H$ at a top end of the first hole 301 and a minimum diameter that corresponds to a diameter $\Delta 301L$ at a bottom end of the first hole 301.

The second hole 302 may be a region including an empty space that extends along the first direction D1 from a top surface of the liner 104 on the bottom surface of the recess R1 to the top surface of the landing pad 400 in the first wiring layer 102.

The second hole 302 may expose the landing pad 400. The second hole 302 may have a diameter that decreases with decreasing distance from the landing pad 400. The diameter of the second hole 302 may decrease, for example, almost linearly. In other embodiments, the diameter of the first hole 301 may have a curved or stepped decrease. Therefore, the second hole 302 may have a maximum diameter that corresponds to a diameter $\Delta 302H$ at a top end of the second hole 302 and a minimum diameter that corresponds to a diameter $\Delta 302L$ at a bottom end of the second hole 302.

The first hole 301 may have at its one lateral surface 301S a slope $\theta 1$ greater than a slope $\theta 2$ at one lateral surface 302S of the second hole 302. The maximum diameter $\Delta 302H$ of the second hole 302 may be less than the minimum diameter $\Delta 301L$ of the first hole 301. The lateral surface 301S of the first hole 301, a bottom surface 301B of the first hole 301, and the lateral surface 302S of the second hole 302 may be connected to each other to constitute a stepwise or stepped shape.

The second hole 302 may partially expose the top surface 400T of the landing pad 400. For example, the first wiring layer 102 may cover a portion of the top surface 400T of the landing pad 400. When viewed in plan, the second hole 302 may be surrounded by the landing pad 400.

A mask layer 105 may be provided on the liner 104. The mask layer 105 may have an average thickness greater than two times that of the liner 104. The mask layer 105 may cover a portion of the liner 104. The mask layer 105 may be disposed on the top surface of the first dielectric layer 103 and also on a corner that connects the top surface of the first dielectric layer 103 to the lateral surface of the first dielectric layer 103. The mask layer 105 may be disposed on the lateral surface of the first dielectric layer 103 within the through hole 300. The mask layer 105 may be disposed on an upper portion of the lateral surface of the first semiconductor substrate 101 within the through hole 300. For example, the mask layer 105 may be locally placed on the lateral surface of the first semiconductor substrate 101. The mask layer 105 may screen an circumference CL of the first hole 301. Accordingly, a maximum diameter $\Delta$OP of the first hole 301 exposed by the mask layer 105 may be less than the maximum diameter $\Delta$301H of the first hole 301. The maximum diameter $\Delta$302H of the second hole 302 may be less than the maximum diameter $\Delta$OP of the first hole 301 exposed by the mask layer 105.

The minimum diameter $\Delta$302L of the second hole 302 may be less than a width $\Delta$400D in a second direction D2 of the landing pad 400, which second direction D2 is parallel to the top surface of the first semiconductor substrate 101. The minimum diameter $\Delta$301L of the first hole 301 may be greater than the width $\Delta$400D in the second direction D2 of the landing pad 400.

A through electrode TE may be provided in the through hole 300. The through electrode TE may include a conductive material with which the through hole 300 is filled. For example, the conductive material may include copper. A barrier metal layer (not shown) may be provided between the through electrode TE and the through hole 300. The through electrode TE may have a top surface at substantially the same level as that of a top surface of the mask layer 105. The through electrode TE may have a bottom surface at substantially the same level as that of the top surface 400T of the landing pad 400. The bottom surface of the through electrode TE may be in contact with the top surface 400T of the landing pad 400. The through electrode TE may be electrically connected to the landing pad 400.

The through electrode TE may be provided thereon with a third dielectric layer 106 and an external connection pad 107. A portion of the third dielectric layer 106 may be exposed such that the external connection pad 107 and the through electrode TE may overlap each other along the first direction D1 and may have electrical connection with each other.

FIGS. 2A to 2E illustrate a fabrication method according to some example embodiments of the present inventive concepts. It will be understood that, in some example embodiments, the method of manufacturing a semiconductor device according to some example embodiments may omit at least some of the operations shown in FIGS. 2A to 2E and/or may perform at least some of the operations shown in FIGS. 2A to 2E out of order in relation to the order (e.g., sequence) of operations shown in FIGS. 2A to 2E.

Figure 2A:
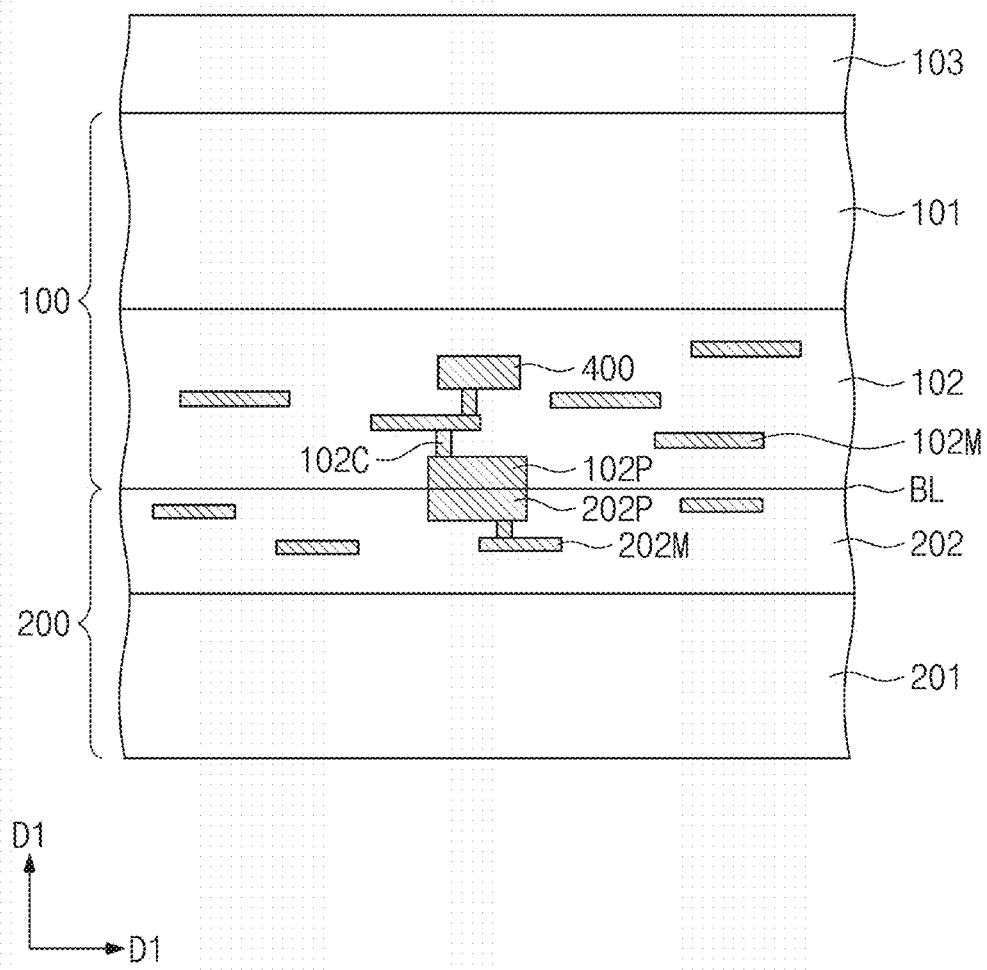
FIGS. 2A to 2E illustrate cross-sectional views showing a method of fabricating a semiconductor package according to some example embodiments of the present inventive concepts.

Referring to FIG. 2A, a first die 100 may be bonded a second die 200. The first die 100 and the second die 200 may be bonded to each other through a bonding layer BL. The first die 100 may be turned upside down as shown in FIG. 2A. Before the first die 100 is turned upside down, the first die 100 may include a first semiconductor substrate 101 and a first wiring layer 102 that are sequentially stacked. The first wiring layer 102 may be provided therein with a first conductive pattern 102M, a first conductive contact 102C, a first connection pad 102P, and a landing pad 400. The second die 200 may include a second semiconductor substrate 201 and a second wiring layer 202 that are sequentially stacked. The second wiring layer 202 may be provided therein with a second conductive pattern 202M, a second conductive contact 202C, and a second connection pad 202P. After that, a first dielectric layer 103 may be formed on the first semiconductor substrate 101. The first dielectric layer 103 may be formed by, for example, chemical mechanical deposition (CVD).

Figure 2B:
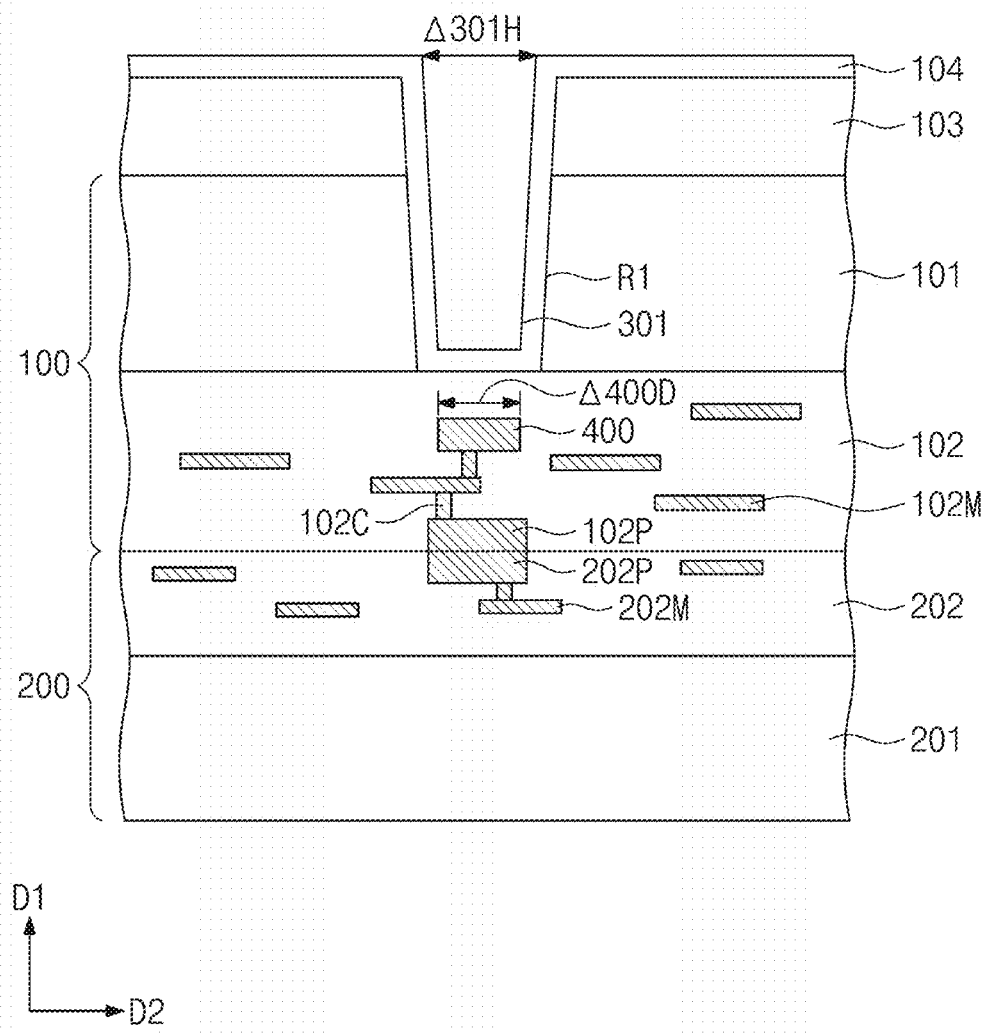

Referring to FIG. 2B, a recess R1 may be formed in the first semiconductor substrate 101 and the first dielectric layer 103. The recess R1 may be formed by using a mask pattern (not shown) that is formed through a photoresist process. The mask pattern (not shown) may be used as an etching mask to sequentially etch the first dielectric layer 103 and the first semiconductor substrate 101 to form the recess R1 that exposes a top surface of the first wiring layer 102. After the formation of the recess R1, the mask pattern (not shown) may be removed.

Afterwards, a liner 104 may be formed to conformally cover the first semiconductor substrate 101 and the first dielectric layer 103 that have the recess R1 formed therein. The liner 104 may be formed by, for example, chemical vapor deposition (CVD). A first hole 301 may be defined to refer to the recess R1 whose empty space is reduced due to the liner 104.

The first hole 301 may have a maximum diameter $\Delta$301H greater than a width $\Delta$400D in a second direction D2 of the landing pad 400. When an etching process is performed to expose the landing pad 400 immediately after the formation of the liner 104, a portion of the first wiring layer 102 may be etched wider than the width $\Delta$400D in the second direction D2 of the landing pad 400. A profile error may occur when the first wiring layer 102 is etched on its portion that does not correspond to the landing pad 400.

Figure 2C:
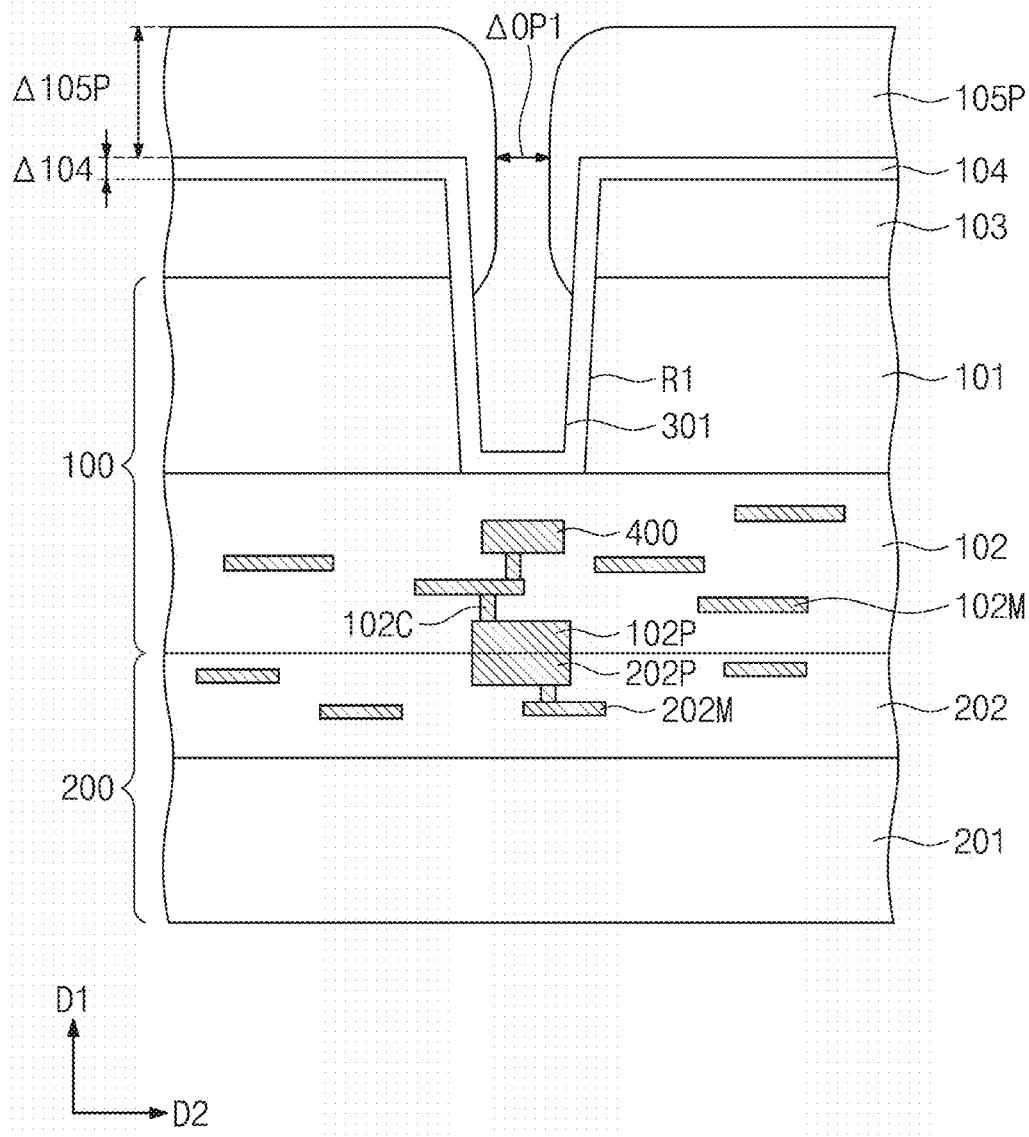

Referring to FIG. 2C, a mask pattern 105P may be selectively formed on a portion of the liner 104. The mask pattern 105P may have a thickness $\Delta$105P greater than ten times a thickness $\Delta$104 of the liner 104. The mask pattern 105P may be deposited by, for example, chemical vapor deposition (CVD). The mask pattern 105P may include an etch stop material, such as silicon nitride (SiN). For example, the mask pattern 105P may be formed on a top surface and a corner of the first dielectric layer 103, which corner connects the top surface of the first dielectric layer 103 to a lateral surface of the first dielectric layer 103. The mask pattern 105P may be formed on the lateral surface of the first dielectric layer 103 within the first hole 301. The mask pattern 105P may be formed on an upper portion of a lateral surface of the first semiconductor substrate 101 within the first hole 301. For example, the mask pattern 105P may be locally formed on the lateral surface of the first semiconductor substrate 101.

Because the mask pattern 105P covers an upper lateral surface of the first hole 301, an exposed portion of the first hole 301 may become narrow. A diameter $\Delta$OP1 of the first hole 301 exposed by the mask pattern 105P may be less than a maximum diameter (see $\Delta$301H of FIG. 1A) of the first hole 301. The diameter $\Delta$OP1 of the first hole 301 exposed by the mask pattern 105P may be less than about 90% of the maximum diameter $\Delta$301H of the first hole 301. For example, the diameter $\Delta$OP1 of the first hole 301 exposed by the mask pattern 105P may be about 80% of the maximum diameter $\Delta$301H of the first hole 301. In other embodiments, the diameter $\Delta$OP1 of the first hole 301 exposed by the mask pattern 105P may be less than a minimum diameter (see $\Delta$301L of FIG. 1A) of the first hole 301.

Figure 2D:
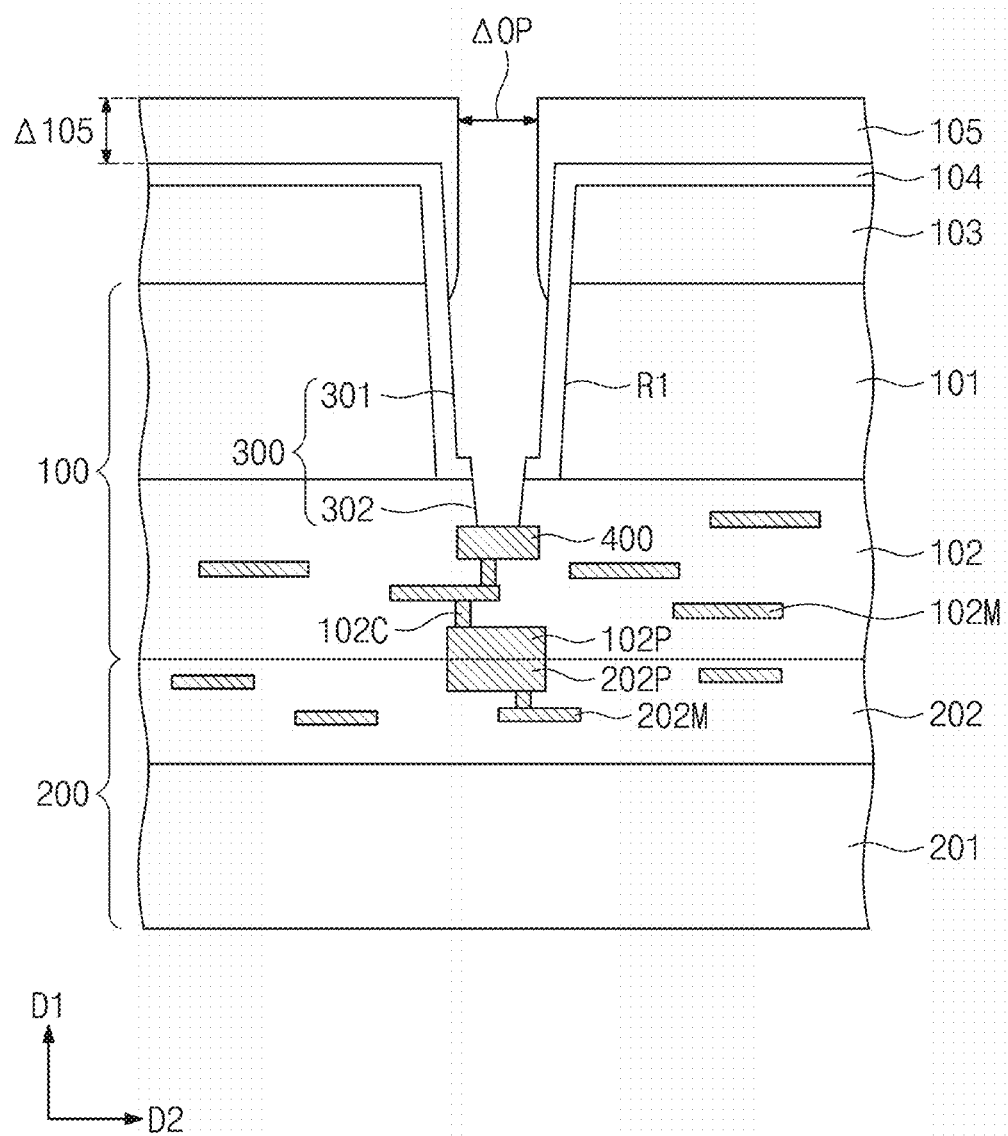

Referring to FIG. 2D, an etching process be performed to form a second hole 302. Ions generated from plasma in an etching chamber may be accelerated toward the first semiconductor substrate 101 during the etching process, and the mask pattern 105P may screen portions of the ions, with the result that a top surface of the first semiconductor substrate 101 and a circumference at a bottom end of the first hole 301 may be protected from the ions. Accordingly, the mask pattern 105P may allow portions of the ions to pass through the first hole 301, and it may thus be possible to etch only a portion of a bottom surface of the first hole 301.

During the etching process, the mask pattern 105P may be partially etched into a mask layer 105. The mask layer 105 may have a thickness Δ105 less than the thickness Δ105P of the mask pattern 105P. For example, a diameter ΔOP of the first hole 301 exposed by the mask layer 105 may be greater than the diameter ΔOP1 of the first hole 301 exposed by the mask pattern 105P.

A second hole 302 may be formed which extends from a top surface of the liner 104 on a bottom surface of the recess R1 to a top surface of the landing pad 400 in the first wiring layer 102. Even after the etching process is terminated, the liner 104 may remain on the bottom surface of the first hole 301. The second hole 302 may partially expose the top surface of the landing pad 400. The first hole 301 and the second hole 302 may be spatially connected to each other to form a through hole 300.

Figure 2E:
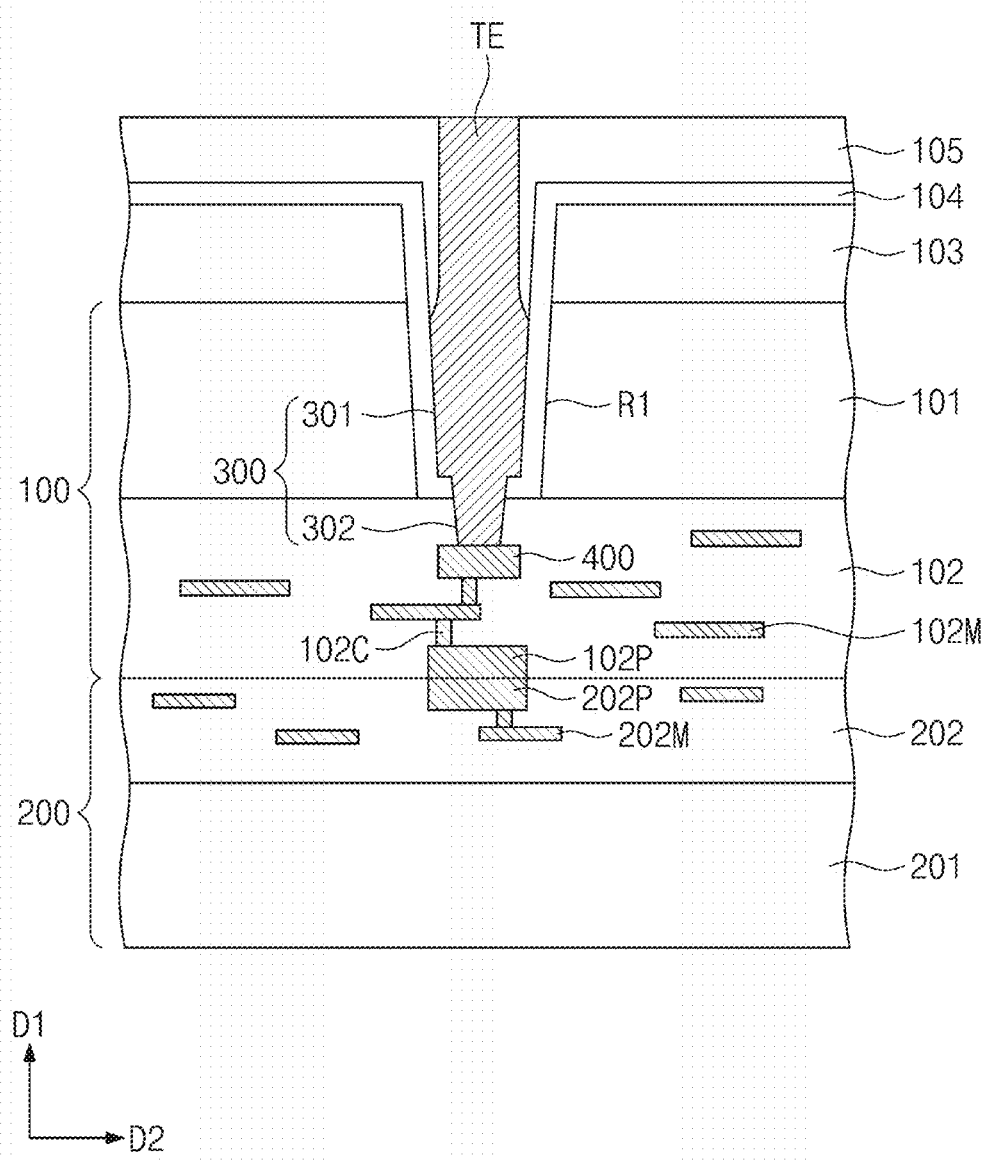

Referring to FIG. 2E, a barrier metal layer (not shown) may be formed in the through hole 300. After that, an electroplating deposition process or the like may be performed such that a conductive material may be introduced into the through hole 300. The conductive material may include, for example, copper. Then, the conductive material may undergo a planarization process, such as chemical mechanical polishing (CMP), to form a through electrode TE.

Referring back to FIG. 1A, a third dielectric layer 106 may be deposited on the mask layer 105 and the planarized through electrode TE. A patterning process may then be performed to expose a top surface of the through electrode TE. Thereafter, an external connection pad 107 may be formed on the through electrode TE.

In related via-last schemes, when a landing pad is smaller than a diameter of a first hole, there may occur a problem that while a process is performed to open the landing pad, a wiring layer may be etched on its region other than its etching-target region above the landing pad. Further, when a photolithography process is performed to form the first hole, only a slight misalignment between the landing pad and the first hole may cause etching problems on non-etching target regions of the wiring layer.

According to the present inventive concepts, because a mask pattern is used to form a second hole, the first hole and the second hole may constitute an injection structure and the second hole may be disposed exactly on the landing pad. Moreover, even when the landing pad and the first hole are slightly misaligned with each other during a photolithography process to form the first hole, a width of the second hole may be small enough to reduce problems that the wiring layer is etched on its region other than its etching-target region on the landing pad.

In accordance with a semiconductor package including a through hole and a method of fabricating the same, an undesired etching damage may be minimized when a TSV is formed to open the landing pad. As a result, it may be possible to provide a semiconductor package with improved reliability.

While the inventive concepts has been described with reference to example embodiments thereof, it will be apparent to those of ordinary skill in the art that various changes and modifications may be made thereto without departing from the spirit and scope of the inventive concepts as set forth in the following claims.

What is claimed is:

1. A semiconductor package, comprising:
   a first wiring layer;
   a first semiconductor substrate on the first wiring layer;
   a first dielectric layer spaced apart from the first wiring layer with the first semiconductor substrate interposed therebetween;
   a landing pad in the first wiring layer;
   a through hole that penetrates the first semiconductor substrate, the first dielectric layer, and the first wiring layer, the through hole exposing the landing pad, the through hole including a first hole and a second hole on a bottom end of the first hole, the second hole having a maximum diameter less than a minimum diameter of the first hole;
   a through electrode in the through hole;
   a liner on a lateral surface and at least a portion of a bottom surface of the first hole, the liner vertically overlapping a horizontal surface of the through electrode; and
   a mask layer on an upper lateral surface of the through electrode,
   wherein the liner include a dielectric material.

2. The semiconductor package of claim 1, wherein a minimum diameter of the second hole is less than a width of the landing pad.

3. The semiconductor package of claim 1, wherein a diameter at a top end of the first hole is greater than a width of the landing pad.

4. The semiconductor package of claim 1, wherein, when viewed in a plan view, a diameter at a top end of the first hole exposed by the mask layer is less than a maximum diameter of the first hole.

5. The semiconductor package of claim 1, further comprising:
   a die on a bottom surface of the first wiring layer,
   wherein
      the die includes a second semiconductor substrate and a second wiring layer that are sequentially stacked, and
      the first wiring layer and the second wiring layer are electrically connected to each other.

6. The semiconductor package of claim 1, wherein a lateral surface of the first hole, a bottom surface of the first hole, and a lateral surface of the second hole are connected to each other in a stepwise shape.

7. The semiconductor package of claim 1, wherein
   the through hole has an injection shape, and
   a slope at one lateral surface of the first hole is less than a slope at one lateral surface of the second hole.

8. The semiconductor package of claim 1, wherein, when viewed in a plan view, a center of the first hole and a center of the second hole are substantially the same.

9. The semiconductor package of claim 1, wherein the first wiring layer covers a portion of a top surface of the landing pad.

10. The semiconductor package of claim 1, wherein, when viewed in a plan view, a bottom end of the second hole is surrounded by the landing pad.

11. The semiconductor package of claim 1, wherein, when viewed in a plan view, a top end of the second hole is surrounded by the liner on the bottom surface of the first hole.

12. The semiconductor package of claim 11, wherein
   the mask layer is on the liner, and
   an average thickness of the mask layer is greater than two times an average thickness of the liner.

13. The semiconductor package of claim 11, wherein
the liner includes silicon oxide ($SiO_2$), and
the mask layer includes silicon nitride (SiN).

14. The semiconductor package of claim 1, further comprising:
a through electrode in the through hole,
wherein a top surface of the through electrode is at a level the same as a level of a top surface of the mask layer.

15. A semiconductor package, comprising:
a first wiring layer;
a first semiconductor substrate on the first wiring layer;
a first dielectric layer spaced apart from the first wiring layer with the first semiconductor substrate interposed therebetween;
a landing pad in the first wiring layer;
a through electrode that penetrates the first semiconductor substrate, the first dielectric layer, and the first wiring layer, the through electrode connecting the landing pad, the through electrode including a first part and a second part on a bottom end of the first part, a top end of the second part having a width less than a width of the bottom end of the first part;
a mask layer on an upper surface of the first dielectric layer,
an external connection pad on the through electrode; and
a die electrically connected to the first wiring layer,
wherein the mask layer extends between a side surface of the first part of the through electrode and a side wall of the first dielectric layer, and
wherein the mask layer exposes a side surface of the second part of the through electrode.

16. A method of fabricating a semiconductor package, the method comprising:
forming a first hole in a semiconductor substrate and in a first dielectric layer on the semiconductor substrate, the first dielectric layer being on an upper surface of the semiconductor substrate;
forming a liner on lateral and bottom surfaces of the first hole, and;
forming a mask pattern on an upper lateral surface of the first hole, the liner being directly between the first dielectric layer and the mask pattern; and
forming a second hole in a first wiring layer on a bottom surface of the semiconductor substrate, the second hole vertically overlapping the first hole, the second hole exposes a landing pad in the first wiring layer, and the second hole having a diameter less than a diameter of the first hole, and the semiconductor substrates being on an upper surface of the first wiring layer, the liner remaining on the bottom surface of the first hole after forming the second hole.

17. The method of claim 16, wherein
forming the mask pattern includes depositing an etch stop material that extends from the upper lateral surface of the first hole toward a center of the first hole, and
a diameter of the first hole exposed by the mask pattern is less than a diameter at a bottom end of the first hole.

18. The method of claim 16, wherein forming the second hole includes etching the first wiring layer by allowing etching materials to pass through an upper region of the first hole exposed by the mask pattern.

19. The method of claim 16, before forming the first hole, further comprising:
connecting a die onto a bottom surface of the first wiring layer, the die including a second semiconductor substrate and a second wiring layer that are sequentially stacked, and the first wiring layer and the second wiring layer are electrically connected to each other.

* * * * *